United States Patent
Geutjens et al.

(10) Patent No.: US 11,161,143 B2
(45) Date of Patent: Nov. 2, 2021

(54) APPLICATION OF A COATING ON A BASE STRUCTURE

(71) Applicant: QLAYERS HOLDING B.V., The Hague (NL)

(72) Inventors: Ruben Geutjens, Delft (NL); Amber Egon Van Hauwermeiren, Rotterdam (NL)

(73) Assignee: QLAYERS HOLDING B.V., The Hague (NL)

( * ) Notice: Subject to any disclaimer, the term of this patent is extended or adjusted under 35 U.S.C. 154(b) by 0 days.

(21) Appl. No.: 16/972,785

(22) PCT Filed: Jun. 6, 2019

(86) PCT No.: PCT/NL2019/050343
§ 371 (c)(1),
(2) Date: Dec. 7, 2020

(87) PCT Pub. No.: WO2019/235929
PCT Pub. Date: Dec. 12, 2019

(65) Prior Publication Data
US 2021/0245195 A1     Aug. 12, 2021

(30) Foreign Application Priority Data

Jun. 8, 2018   (NL) ...................... 2021092

(51) Int. Cl.
*B05D 3/14*   (2006.01)
*B05D 3/02*   (2006.01)
*B05D 5/00*   (2006.01)

(52) U.S. Cl.
CPC ............ *B05D 3/14* (2013.01); *B05D 3/0254* (2013.01); *B05D 5/00* (2013.01)

(58) Field of Classification Search
None
See application file for complete search history.

(56) References Cited

U.S. PATENT DOCUMENTS

2014/0054822 A1*   2/2014   Ellison ...................... G03F 7/26
                                                                    264/293

FOREIGN PATENT DOCUMENTS

| EP | 2 827 193 A1 | 1/2015 | |
| EP | 2827193 A1 * | 1/2015 | ............ B01J 19/123 |
| WO | WO 01/47003 A2 | 6/2001 | |

OTHER PUBLICATIONS

Micro- and nano-patterns created via electrohydrodynamic instabilities. Nano Today (2009) vol. 4 pp 180-192 (Year: 2009).*

(Continued)

*Primary Examiner* — Cachet I Proctor
(74) *Attorney, Agent, or Firm* — Birch, Stewart, Kolasch & Birch, LLP

(57) ABSTRACT

A method and apparatus provide a base structure at least partially with a cured polymer coating having microscopic polymer structures. The method includes applying an uncured polymer material on at least a part of the base structure, the uncured polymer material being electrically charged with a charge that has a first sign; providing at least one electrode at a distance above at least a part of said uncured polymer material; charging the at least one electrode with an electrical charge that has a second sign opposite to the first sign, thereby electrostatically attracting uncured polymer material towards the at least one electrode and deforming the uncured polymer material into uncured structured polymer material comprising one or more uncured microscopic polymer structures that have a shape; and curing the one or more uncured microscopic polymer structures, thereby forming the cured polymer coating.

15 Claims, 4 Drawing Sheets

(56) References Cited

OTHER PUBLICATIONS

Dutch Search Report, issued in Priority Application No. 2021092, dated Feb. 21, 2019.
International Search Report, issed in PCT/NL2019/050343, dated Oct. 1, 2019.
Written Opinion of the International Searching Authority, issed in PCT/NL2019/050343, dated Oct. 1, 2019.
Wu et al., "Micro- and nano-patterns created via electrohydrodynamic instabilities", Nano Today, 2009, vol. 4, pp. 180-192.

\* cited by examiner

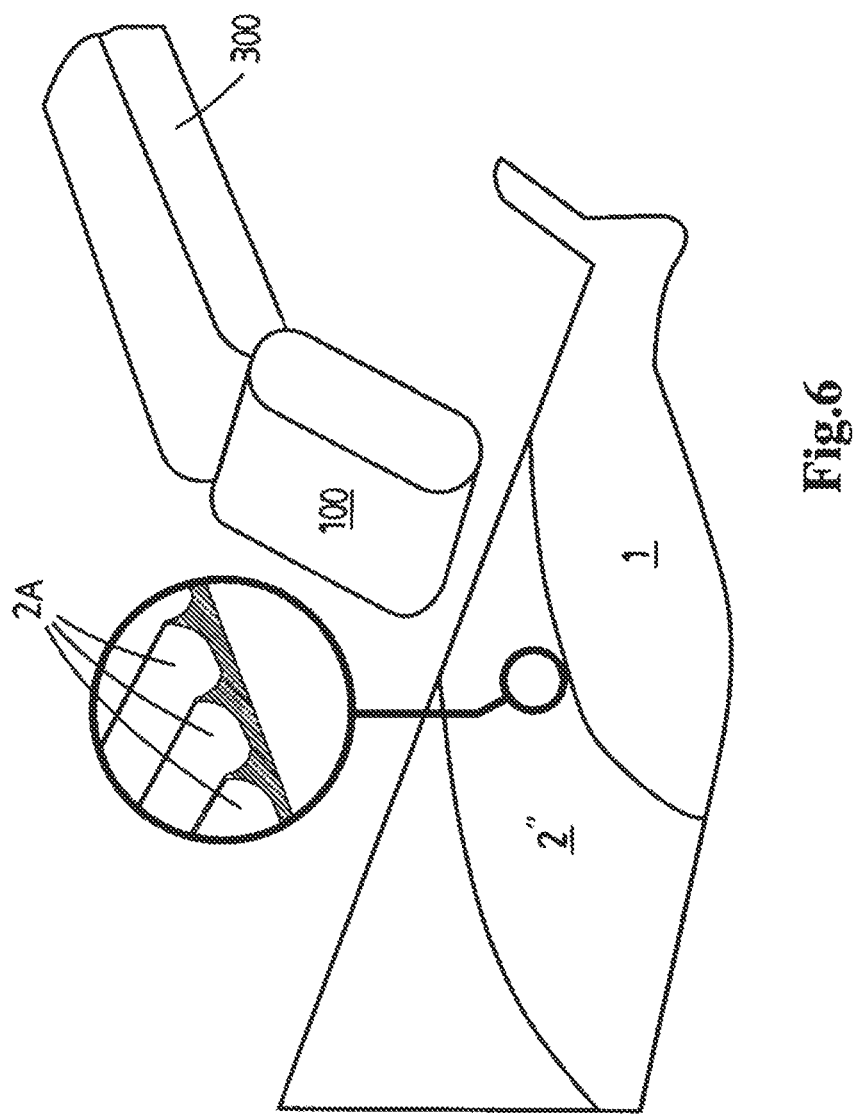

APPLICATION OF A COATING ON A BASE STRUCTURE

FIELD OF THE INVENTION

The present invention relates to a method, an assembly, and a system to provide a base structure at least partially with a cured polymer coating having microscopic polymer structures.

BACKGROUND OF THE INVENTION

It is now known for several decades already that specifically shaped coatings on surfaces may help to e.g. reduce the drag of that surface. For example, when analysing the skin of a shark on a microscopic scale, one may observe that it consists of riblets (ridges or ribs), running parallel to each other in a lengthwise direction. These riblets help to reduce the drag of the shark as the shark swims through water. Such microscopic patterns are observed throughout nature, for many different applications. The reduction of drag is mentioned here as merely an example. Other examples may include a self-cleaning coating, an anti-graffiti coating, an anti-fouling coating or an hygroscopic coating.

Also for several decades already, it is desired to apply such coatings, e.g. polymer coatings, of a microscopic scale on man-made items, e.g. vehicles including cars, race cars, airplanes, vessels, bikes, or e.g. wind turbine blades, e.g. to reduce the drag of such man-made items. While many attempts have previously been made to apply such coatings, suitable commercially applicable methods have not been found in the past.

In the scientific article "micro- and nano-patterns created via electrohydrodynamic instabilities", published in the journal Nano Today in 2009, Wu and Russel describe a method to form a cured polymer coating on a base structure. The method consists of spin coating a thin layer of polymer on a silicon substrate, putting a top electrode on top of the polymer film, heating the whole system above the glass transition temperature of the polymer and imposing an external voltage, waiting for seconds to weeks until a pattern formation forms, and freezing said pattern formation by cooling the system back to room temperature quickly.

According to the paper, this method suffers from severe instabilities in the formation of the polymer structures. According to the paper, polymer structures formed by this method have a loss of order for large surfaces, i.e. patterns formed by this method are irregular when applied on large surfaces. This makes the described method unsuited for large-scale (industrial) application.

OBJECT OF THE INVENTION

It is an object of the invention to at least partially overcome the instabilities of the above-described method. More specifically, it is an object of the present invention to provide a more reliable, repeatable and/or predictable method to provide a base structure at least partially with a cured or frozen polymer coating.

SUMMARY OF THE INVENTION

Therefore, the invention presents:
a method to provide a base structure at least partially with a cured polymer coating having microscopic polymer structures, the method comprising the steps of:
applying an uncured polymer material on at least a part of the base structure, the uncured polymer material being electrically charged with a charge that has a first sign;
providing at least one electrode at a distance above at least a part of said uncured polymer material;
charging the at least one electrode with an electrical charge that has a second sign opposite to the first sign, thereby electrostatically attracting uncured polymer material towards the at least one electrode and deforming the uncured polymer material into uncured structured polymer material comprising one or more uncured microscopic polymer structures that have a shape, wherein electrostatically attracting the uncured polymer material towards the at least one electrode grows the one or more uncured microscopic polymer structures towards the at least one electrode;
curing the one or more uncured microscopic polymer structures, thereby forming the cured polymer coating;
the method being characterised in that, before or during the step of curing the one or more uncured microscopic polymer structures, the method comprises the step of
stopping or reducing the growth of the uncured microscopic polymer structure for controlling and stabilizing the shape of the one or more uncured microscopic polymer structures, with the uncured structured polymer material being at a distance from the at least one electrode, thereby preventing contact between the uncured polymer material and the at least one electrode at all times, by:
monitoring the occurrence and amperage of a current between the electrode and the uncured microscopic polymer structures, and measuring the current between the electrode and the uncured microscopic polymer structure, while the at least one electrode is charged;
setting a threshold value for said amperage;
when said threshold value of amperage is exceeded, at least reducing said amperage by:
reducing the electrical charge on the electrode and/or increasing the distance between the electrode and the uncured microscopic polymer structure.

The invention thus, in other words, relates to a method to provide a base structure at least partially with a cured polymer coating having microscopic polymer structures, the method comprising the steps of:
applying an uncured polymer material on at least a part of the base structure, the uncured polymer material being electrically charged with a charge that has a first sign;
providing at least one electrode at a distance above at least a part of said uncured polymer material;
charging the at least one electrode with an electrical charge that has a second sign opposite to the first sign, thereby electrostatically attracting uncured polymer material towards the at least one electrode and deforming the uncured polymer material into uncured structured polymer material comprising one or more uncured microscopic polymer structures that have a shape;
controlling and stabilizing the shape of the one or more uncured microscopic polymer structures, by:
monitoring the occurrence and amperage of a current between the electrode and the uncured microscopic polymer structures, while the at least one electrode is charged;
setting a threshold value for said amperage;
when said threshold value of amperage is exceeded, at least reducing said amperage by:

reducing the charge on the electrode and/or increasing the distance between the electrode and the uncured microscopic polymer structure, and curing the one or more uncured microscopic polymer structures, thereby forming the cured polymer coating.

In the known methods to form a cured polymer coating, it is not possible to obtain cured microscopic polymer structures of a consistent and predictable shape. In the Wu and Russel article it is stated that "the polymeric microstructures are far from equilibrium", and that "to date, there is no convincing experimental distinction between the "perfect" and "leaky" dielectric models". Although the prior art has shown a successful formation of cured microscopic polymer structures, the shape of these structures is not predictable and inconsistent.

For application on an industrial scale however, reliable, repeatable and predictable shapes and patterns are desired. Hence, for such industrial applications the method of the prior art does not suffice.

This problem of obtaining a reliable, repeatable and predictable shape and pattern of the cured microscopic polymer structures that define the coating is solved, at least partially, according to the present invention by adding the step of controlling and stabilising the shape of the one or more uncured microscopic polymer structures.

This control and stabilisation of the shape of the uncured microscopic polymer structure is allowed by monitoring the occurrence and amperage of a current between the electrode and the uncured microscopic polymer structure, while at least one electrode is charged. As is already recognized in the prior art, when the polymer structures start to form, first a small amount of polymer material will rise towards the electrode as a result of electrostatic attraction. As the polymer material becomes nearer the electrode, the electrostatic attraction becomes larger and the polymer structure grows faster and faster.

The applicant has found that, as the polymer structure grows faster and faster, the electrostatic attraction becomes so large that eventually the polymer material contacts the electrode. Just before the polymer material contacts the electrode, it spikes towards the electrode. This event of polymer material spiking towards the electrode is called "spraying". This contact and spraying is undesired, as then the charge of the uncured polymer material is absorbed by the electrode and its powering unit, the electrostatic attraction vanishes, and the polymer structure vanishes as the uncured polymer material is pulled down again by gravity.

The applicant has further found that, before the uncured polymer material contacts the electrode, a minute but measurable current already starts to flow between the electrode and the uncured microscopic polymer structure, as a result of electrons being separated from one of the polymer material and the electrode towards the other of the polymer material and the electrode due to the electrostatic attraction (the flow direction of the electrons depending on the charge of the electrode and the uncured polymer material).

The applicant has found that by measuring and monitoring this current of electrons between the electrode and the uncured microscopic polymer structure, the shape of the uncured microscopic polymer structure can be stabilized and controlled. Namely, according to the invention, when the amperage of this current exceeds a threshold value, a measure is taken to reduce the amperage of the current between the uncured microscopic polymer structure and the electrode. When the amperage of the current between the uncured microscopic polymer structure and the electrode can be successfully reduced, the shape of the polymer structure can be stabilized and cured, thereby forming the coating.

The measure taken to reduce the amperage of the current between the uncured microscopic polymer structure and the electrode can be reducing the charge on the electrode and/or increasing the distance between the electrode and the uncured microscopic polymer structure. Both measures are equivalent in that they have the same effect: reducing the electrostatic attraction between the electrode and the uncured microscopic polymer structure. This reduced electrostatic attraction stops or reduces the growth of the polymer structure and stabilizes its shape. This reduced electrostatic attraction also stops or reduces the flow of electrons between the electrode and the uncured microscopic polymer structure, hence stopping or reducing the amperage of current between the uncured microscopic structure and the electrode.

The present invention relates to a method to provide a base structure at least partially with a cured or frozen polymer coating having microscopic polymer structures. An inherent physical property of most or all polymers is that is has a state in which its shape can be deformed, and a state in which its shape is fixed. According to the present invention, the polymer may either be a thermoset polymer (not allowing to deform the polymer material again after its shape is fixated), or a thermoplastic polymer (allowing to deform the polymer material multiple times). For both a thermoset and a thermoplastic material, the deformable state is referred to as the "uncured" state. That is, an uncured polymer, in the context of the present invention, is a polymer that is in a state in which its shape may be altered. For both a thermoset and a thermoplastic material, the fixed shape is referred to as a "cured" state. That is, a cured polymer, in the context of the present invention, is a polymer that is in a state in which its shape is fixed. Hence, both the step of curing a thermoset material and the step of freezing a thermoplastic material, in the context of the present invention, are referred to as a "curing" step.

Preferably, the viscosity of the polymer, in the uncured state, is relatively low. This allows to deform the polymer relatively fast, which may be beneficial if application on an industrial scale is desired. Examples of polymers which have been found suitable in preliminary test by the applicant include e.g. epoxy polymers; polyurethanes and polyacrylates. It is however foreseen that many other polymer materials are also suited to use in the method, and the invention is not limited to only the polymers listed here.

In embodiments, the polymer material is a composite material, e.g. comprising a mixture of different polymers or a mixture of polymer and non-polymer materials.

According to the invention, the polymer structures formed in the polymer material are microscopic. For example, the structures may be of the nanometer or micrometer scale. For example, the structures may be hardly visible with the human eye, or even invisible with the human eye without using any aids, such as a microscope or a loop.

According to the invention, an uncured polymer material is applied on at least a part of the base structure. Many methods are known to apply an uncured polymer material on a base structure, and the invention is not limited to either one of them. Any method may be used. Examples of methods are e.g. electrospinning or electrohydrodynamic printing.

The uncured polymer material, when applied to the base structure or after it is applied to the base structure, is electrically charged with a charge that has a first sign. This charge may be relatively weak, e.g. in the order of 1-5 mC/m². For example, the charge on the uncured polymer material may be larger than 1 mC/m². The maximum charge applied on the uncured polymer material may be up to tens of mC/m², or larger. The maximum charge applied on the uncured polymer material is inter alia depending on the used material, the humidity of the environment, and other atmospheric conditions. The uncured polymer material may have a positive charge or a negative charge.

According to the invention, at least one electrode is provided at a distance above at least a part of the uncured polymer material. Hence, compared to the dimensions of the base structure, the electrode may be small. Whereas the base structure may be anywhere from a few square centimetres or smaller, up to a hundreds of square meters or larger, the electrode is preferably of the millimetre or sub-millimetre range or smaller. Electrodes of the micrometre scale or even smaller are conceived.

It is however also possible that both the electrode and the base structure are of a microscopic scale, e.g. in the micrometre range or smaller. It is possible that the electrode has the same size as the base structure, or that the electrode is larger than the base structure.

In a possible embodiment, more than one electrode is provided above the base structure. For example, the electrodes may be movable along the base structure in a movement direction, whereas multiple electrodes are provided; e.g. aligned in a direction substantially perpendicular to the movement direction.

In a possible embodiment, the electrode, at its side that faces the polymer material, is substantially flat. In another embodiment the electrode, at its side facing the polymer material, has a sharp and/or pointed shape.

The electrode or electrodes is (are) provided at a distance above the polymer material. Preferably, contact between the uncured or cured polymer material and the electrode is prevented at all times when performing the method. Preferably, the distance between the polymer material and the electrode is small, e.g. less than 2 mm.

According to the invention, the electrode is charged with an electrical charge that is opposite of the charge of the uncured polymer material. Due to the charge on the electrode, and the sign difference between the charge on the electrode and the charge on the uncured polymer material, uncured polymer material is electrostatically attracted towards the electrode. As a result of that, a polymer structure, e.g. having a peaked shape, is formed from the polymer material.

According to the invention, the method comprises the step of controlling and stabilizing the shape of the one or more uncured microscopic polymer structures after they are formed, as was described in the above.

During or directly after controlling and stabilizing the shape of the uncured microscopic polymer structures, the method according to the invention includes the step of curing the one or more uncured microscopic polymer structures, thereby forming the cured polymer coating.

Many methods to cure an uncured polymer are known, including but not limited to cooling of the polymer (in a natural way, by removing the heat, or by adding cold) and applying UV light to the polymer. In the case of a thermoset polymer, heat may be applied to evaporate the solvent in the thermoset polymer and/or to speed up the curing. Any known curing method may be used according to the invention.

After the step of curing the microscopic polymer structures, the base structure is at least partially provided with a cured polymer coating. By moving the electrode along the base structure and repeating the method, the size of the coating may be increased, providing larger portions of the base structure with a cured polymer coating. Eventually, upon continued repetition of the method, the entire base structure may be provided with a coating.

In an embodiment according to the invention, the method further comprises the steps of moving the electrode to a different position above the base structure, and repeating all method steps. As the electrode is moved along the base structure and the method is performed, patterns of microscopic polymer structures may be formed. For example, parallel rows of riblet-shaped (ribbed, ridge-shaped) polymer structures may be formed while moving the electrode and repeating the method. For example, the spacing between multiple rows may be the same, while also the riblet-shaped structures have a same height. Several different overlapping or non-overlapping patterns of the microscopic polymer structures may however also be applied to a relatively large base structure.

In an embodiment of the invention, a tailored pattern of microscopic polymer structures may be formed by repeatedly moving the electrode to a different position above the base structure and repeating all other method steps. For example, by continuing to perform the method according to the invention, e.g. a repeating pattern of microscopic polymer structures may form the coating.

In embodiments, the method further comprises the step of moving the electrode along the base structure, preferably in a straight line, forming one or more elongate riblet-shaped microscopic polymer structures. For example, a system configured to perform the method according to the invention may comprise three consecutive devices/modules: a polymer application device that is configured to apply an uncured polymer material on a base structure, the uncured polymer being electrically charged with a charge that has a first sign; a control device or assembly that comprises an electrode configured to form the uncured structured polymer material comprising one or more uncured microscopic polymer structures and to control and stabilise the formed microscopic polymer structure, the control device or assembly being arranged behind the polymer application device; and a curing device configured to cure the microscopic polymer structure, the curing device e.g. being arranged behind the control device or assembly. The system comprising the polymer application device, the control device or assembly and the curing device may be moved along a base structure, to apply a coating upon movement and operation of the system.

In an embodiment of the invention, the current between the uncured microscopic polymer structure and the electrode is measured through a shunt resistor that is electrically connected in series with the electrode. A shunt resistor is basically a resistor on which in use a voltage is applied, and through which an electrical current can run. When a current runs through the shunt resistor, the voltage applied on it drops. Hence, the larger the current through a shunt resistor, the smaller the voltage applied on it. The shunt resistor is in use provided with a voltage. When no current flows between the electrode and the uncured microscopic polymer structures, the voltage through the shunt resistor substantially equals the voltage provided to the shunt resistor. When a current starts to flow between the electrode and the uncured microscopic polymer structures, this current also reaches the shunt resistor and the voltage through the shunt resistor drops due to this current. By monitoring the voltage through the shunt resistor, the current between the electrode and the uncured microscopic polymer structures can thus be (indirectly) measured and monitored.

In embodiments, the resistance of the shunt resistor is in the order of megaohms, e.g. between 10MΩ and 100MΩ.

In an embodiment of the invention, the threshold value of amperage has a magnitude of less than 100 nanoampere. Depending on the type of measurement unit used to measure the current between the electrode and the uncured microscopic polymer structures, lower current levels may be observed. Using a readily available shunt resistor, e.g. currents of the nanoampere range may be measured.

In embodiments, the electrical charge on the electrode is reduced by shorting a connection between the electrode and a power source or ground. When only one power source is used, this will completely remove the charge on the electrode, and eliminate the electrostatic attraction between the electrode and the polymer material. When the electrode is e.g. charged by multiple power sources, and one of the power sources is shorted, this reduces the charge on the electrode and reduces the electrostatic attraction between the electrode and the polymer material. The time between the measurement of a current between the electrode and the polymer material and the (undesired) spraying of the polymer material towards the electrode is typically very short, e.g. in the order of milliseconds. In one test, the time between measurement of a current and the spraying of polymer was approximately 20 milliseconds. Sufficiently reducing the power output of the power source that powers the electrode may not be possible in this very short amount of time. In that case, shorting of the connection may be preferred.

In an embodiment, a mosfet (metal-oxide-semiconductor field-effect transistor) switch is electrically connected in parallel with the electrode, to at least partially reduce the charge and/or voltage applied on the electrode. The mosfet is connecting the electrode to the ground or the power supply. If the mosfet is switched, a current can travel through the mosfet and the voltage applied over the electrode drops. Hence, by changing the voltage applied on the mosfet, the amount of charge and/or voltage applied to the electrode may be controlled.

Alternatively, when such a fast (i.e., within milliseconds) reduction in power output of the power source is possible, altering the output voltage of the power source that charges the electrode may be applied to reduce the electrical charge on the electrode in an embodiment.

In an embodiment of the invention, the amperage of the current between the electrode and the polymer structure is reduced by moving the electrode away from the base structure and the uncured microscopic polymer structures. This measure also reduces the electrostatic attraction between the electrode and the polymer material, and hence the amperage of the current.

In an alternative embodiment, the base structure may be moved away from the electrode to increase the distance between the electrode and the uncured microscopic polymer structure.

In an embodiment of the invention, the step of curing the one or more uncured microscopic polymer structures is performed while stabilizing the one or more uncured microscopic polymer structures. This allows to form a predictable, reliable, and repeatable polymer structure. Preferably, the curing step is performed fast, e.g. by applying UV light (when the polymer is a UV-curable polymer) with a laser beam and/or by cooling the polymer by removing heat. One advantage of applying UV light is that it can be focused easily, e.g. with a laser beam, such that the curing step and the step of forming the polymer structure can be performed in the vicinity of each other, simultaneously, while not affecting each other.

In embodiments, the uncured microscopic polymer structure is peak-shaped, i.e. has a sharp upper edge. Such a sharp upper edge is for example preferred when a drag-reducing coating is applied to the base structure.

In embodiments, a voltage applied on the electrode to charge it is smaller than 3.5 kV, such as between 1 and 3 kV, preferably between 1.5 and 2.5 kV. Other voltages are however also foreseen. Depending on, inter alia, the distance between the electrode and the polymer material, the medium in between the electrode and the polymer material, and the charge of the polymer material, a suitable voltage may be applied on the electrode.

In embodiments, the distance between the electrode and the uncured polymer material, during the formation of the uncured structured polymer material (and the uncured microscopic polymer structure), is at most 2 mm, such as 1 mm or less. Preferably, the distance between the electrode and the polymer material is as small as possible, while still allowing the formation of structured material (polymer structures). It is conceived that the required charge on the electrode becomes lower when the distance between the electrode and the polymer material is reduced.

In embodiments, air is present between the electrode and the polymer material during the formation of the uncured structured polymer material and the uncured microscopic polymer structures. Preliminary tests show that satisfactory results can be achieved when normal air is present in between the electrode and the uncured polymer material. It is foreseen that a protective environment around the electrode may be beneficial for the predictability and the repeatability of the coating produced by the method, e.g. wherein another medium than air such as an inert gas and/or a (near) vacuum, is present in between the uncured polymer material and the electrode.

In embodiments, the uncured polymer material is applied by electrospinning one or more lines of uncured electrically charged polymer material on the base structure. Electrospinning is one of many known methods to apply an electrically charged polymer material on a base structure. A particular advantage of electrospinning is that local height elevations may already be achieved during application of the polymer material, making the formation of polymer structures more easy.

In embodiments, the uncured polymer material is applied by electrohydrodynamic printing a layer of uncured electrically charged polymer material on the base structure.

Electrohydrodynamic printing is one of many known methods to apply an electrically charged polymer material on a base structure.

In embodiments, the step of applying an uncured polymer material on the base structure includes a first sub-step of applying uncured polymer material on the base structure, followed by a second sub-step of charging said uncured polymer material with an electrical charge. For example, electrons may be blown onto the uncured polymer material to apply a charge to it.

In embodiments, the charge of the uncured, electrically charged polymer material is of the positive sign. In alternative embodiments, the charge of the uncured, electrically charged polymer material is of the negative sign.

In embodiments, the base structure has a double curvature. For example, the base structure may be an aircraft part, such as a fuselage or a wing. For example, the base structure may be a hull of a vessel. For example, the base structure may be a (part of a) vehicle, such as a (race)car, a (race) bicycle, a motor, etc. For example, the base structure may be a wind turbine blade. Especially for a base structure having a double curvature, it is in general very difficult to apply a textured coating to a surface layer thereof. However, as the electrode is provided above the polymer material, in the method according to the invention, the shape of the base structure is not limiting the possible application of the method. The method is thus also suited for the application of a coating on a surface having a double curvature.

In embodiments, the coating applied on the base structure is non-uniform. For example, at parts of the base structure, the formed microscopic polymer structures may be higher and/or closer to each other than at other parts of the base structure. Advantageously, such variation in the microstructural shape of the coating can be achieved with the method according to the invention.

In an embodiment of the invention, the method is an industrial method, wherein the method is e.g. suited to apply an equal coating on a large number of similar products or a coating on a (very) large base structure, while the quality of the coating is consistent, repeatable and predictable.

The invention further relates to an assembly to provide a base structure at least partially with a cured polymer coating having microscopic polymer structures, the base structure being provided with an uncured polymer material that has an electrical charge of a first sign, the assembly comprising:
 at least one electrode, configured to be arranged at a distance above at least a part of the uncured polymer material;
 at least one power source, electrically connected with the electrode and configured to charge the electrode with an electrical charge that has a second sign opposite of the first sign such that, after charging the electrode, uncured polymer material is electrostatically attracted towards the electrode, deforming the uncured polymer material into uncured structured polymer material comprising one or more uncured microscopic polymer structures that have a shape, wherein electrostatically attracting the uncured polymer material towards the at least one electrode grows the one or more uncured microscopic polymer structures towards the at least one electrode;
 a curing source, configured to cure the uncured microscopic polymer structures and form the cured polymer coating;
wherein the assembly further comprises:
 a control unit, configured to stop or reduce the growth of the uncured microscopic polymer structure for controlling and stabilising the shape of the uncured microscopic polymer structure, with the uncured structured polymer material being at a distance from the at least one electrode, thereby preventing contact between the uncured polymer material and the at least one electrode at all times, the control unit comprising:
  a current measurement unit, configured to measure a current between the electrode and the uncured microscopic polymer structure, and to monitor the occurrence and amperage of a current between the electrode and the uncured microscopic polymer structures and arranged in communication with the control unit,
 wherein the control unit allows for the setting of a threshold value for said amperage, and
 wherein the control unit is configured to:
  reduce the charge on the electrode and/or
  increase the distance between the electrode and the uncured microscopic polymer structure
 when said current exceeds said threshold value of amperage.

In other words, one may say that the assembly according is configured to perform the inventive method.

Embodiments described in the above in relation to the method, may also be advantageous for and/or applicable to the assembly according to the invention.

In an embodiment of the invention, the control unit includes a switch, e.g. a mosfet switch, configured to at least partially short the electrical connection between the power source and the electrode. As described in the above, shorting the electrical connection between the power source and the electrode is one of the possible measures to reduce the charge on the electrode, to reduce the current and the electrostatic attraction between the electrode and the polymer structure, and to stabilize the polymer structure.

In embodiments, the control unit is configured to reduce the output voltage of the power source. As described in the above, reducing the output voltage of the power source, especially if it can be done sufficiently fast, is one of the possible measures to reduce the charge on the electrode, to reduce the current and the electrostatic attraction between the electrode and the polymer structure, and to stabilize the polymer structure.

In an embodiment of the invention, the control unit includes an actuator operatively connected to the electrode, the actuator being configured to move the electrode away from the uncured microscopic polymer structure. As described in the above, moving the electrode away from the polymer structure is one of the possible measures to reduce the current and the electrostatic attraction between the electrode and the polymer structure, and to stabilize the polymer structure. For example, the actuator may be a piezo-element or a resilient element.

The present invention further relates to a system to provide a base structure at least partially with a cured polymer coating having microscopic polymer structures, the system comprising: a polymer application device configured to apply uncured polymer material having an electrical charge on a base structure; and the inventive assembly.

The present invention further relates to a mechanical arm comprising the inventive assembly or the inventive system.

According to a second aspect of the invention, a method is presented to provide a base structure at least partially with a coating having microscopic structures, the method comprising the steps of:
 providing a deformable material on at least a part of the base structure, the deformable material being electrically charged with a charge that has a first sign;
 providing at least one electrode at a distance above at least a part of said deformable material;
 charging the at least one electrode with an electrical charge that has a second sign opposite to the first sign, thereby electrostatically attracting deformable material towards the at least one electrode and deforming the deformable material into deformable structured material comprising one or more deformable microscopic structures that have a shape;
 fixating the shape of the one or more deformable microscopic structures, thereby forming the coating;
wherein before or during the step of curing the one or more deformable microscopic structures, the method comprises the step of
 controlling and stabilizing the shape of the one or more deformable microscopic structures, by:

monitoring the occurrence and amperage of a current between the electrode and the deformable microscopic structures, while the at least one electrode is charged;

setting a threshold value for said amperage;

when said threshold value of amperage is exceeded, at least reducing said amperage by:

reducing the electrical charge on the electrode and/or increasing the distance between the electrode and the deformable microscopic structure.

The method according to the second aspect of the invention is similar and comparable to the method according to the first aspect of the invention, with the exception of the material provided on the base structure. The material may be a polymer, but may also be a metal or a composite material. Preferably, the material is in its solid state under atmospheric conditions.

For example, the material is applied on top of the base material when providing the material on at least a part of the base structure.

For example, a top layer of the base structure is at least partially modified (e.g. heated) to make it deformable, thereby providing the material on at least a part of the base structure.

A "deformable" material is a material that is in a state wherein it is possible to deform the shape of the material.

When "fixing" the material, the shape of the material is frozen, cured, or otherwise fixed, such that the material is not deformable anymore, at least until it is modified again.

Embodiments described in relation to the first aspect of the invention, may also be advantageous for the second aspect of the invention. Embodiments described in relation to the first aspect only, can also be applied in combination with the second aspect of the invention.

These and other aspects of the invention will be further elucidated with reference to the attached figures.

BRIEF DESCRIPTION OF THE DRAWINGS

FIG. 6 schematically shows an embodiment of a mechanical arm according to the invention.

DETAILED DESCRIPTION OF EMBODIMENTS

Figure 1:
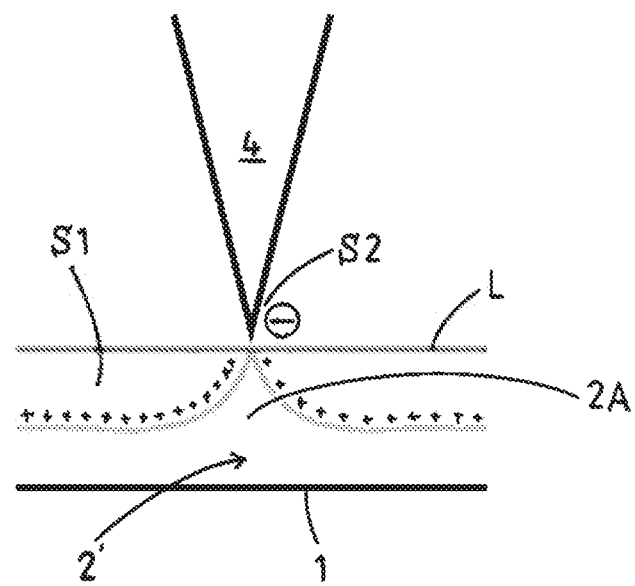
FIG. 1 schematically shows the formation of an uncured structured polymer material including a microscopic polymer structure from uncured polymer material applied on a base structure with an electrode.

Shown in FIG. 1 is an electrode 4, arranged at a distance above a part of a layer of uncured polymer material 2. Here, the electrode 4 is peak-shaped, but this is not necessary. The electrode 4 may e.g. also be flat or curved. The uncured polymer material 2 is applied on a base structure 1, and charged with an electrical charge. Here, the sign 51 of the charge on the uncured polymer material 2 is positive.

As shown in FIG. 1, an electrical charge is also applied to the electrode 4, the charge on the electrode 4 here being negative. That is, the sign S2 of the charge on the electrode 4 is negative the embodiment of FIG. 1. As a result of the charge difference on the electrode 4 and the uncured polymer material 2, the uncured polymer material 2 is electrostatically attracted towards the electrode 4. This electrostatic attraction, as shown, deforms a part of the uncured polymer material 2 into uncured structures polymer material 2' comprising an uncured microscopic polymer structure 2A, that here has a peaked shape. Part of the uncured polymer material 2 is pulled upwards by the electrostatic attraction, and forms into a polymer structure 2A.

As may be explained with reference to FIG. 1, preferably the shape of the polymer structure 2A is controlled and stabilized. More specifically, it is undesired when the polymer structure 2A contacts the electrode 4. It may e.g. be desired that the height of the polymer structure 2A does not exceed imaginary line L. This control and stabilization of the shape of the polymer structure 2A is explained with reference to FIGS. 2 and 4 in the below.

Figure 2:
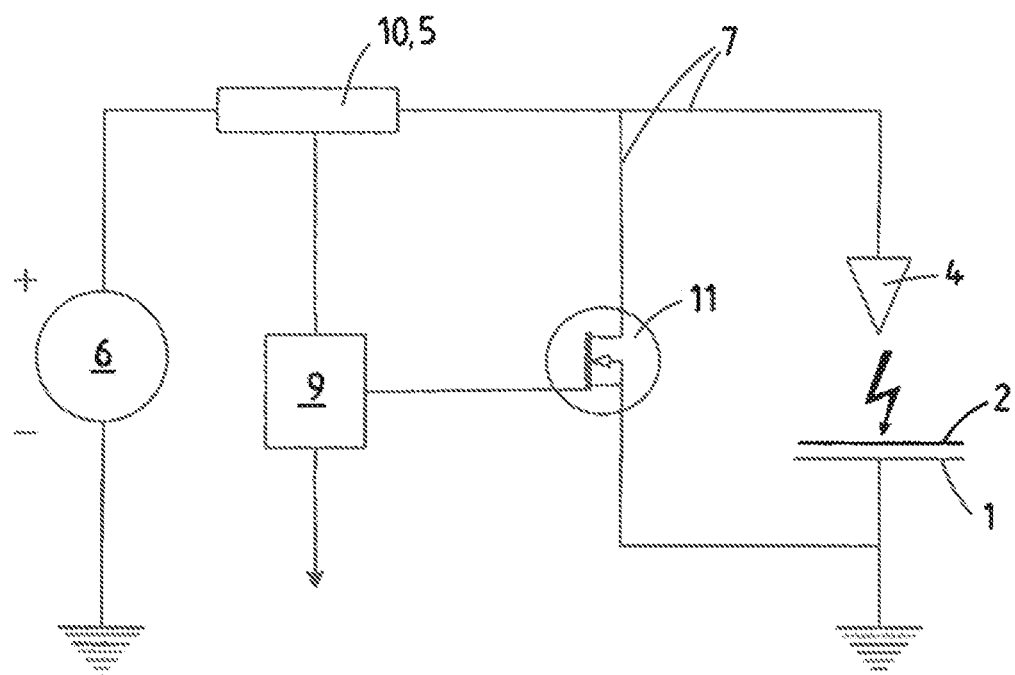
FIG. 2 schematically shows parts of a first embodiment of a system to provide a base structure at least partially with a cured polymer coating having microscopic polymer structures according to the invention.

FIG. 2 shows a part of a system and an assembly to provide a base structure 1 at least partially with a cured polymer coating formed by microscopic polymer structures. In FIG. 2, the base structure 1 is already provided with an uncured polymer material 2 that has an electrical charge. How to apply the uncured polymer material 2 on the base structure 1 is e.g. explained with reference to FIG. 5 in the below.

Shown in FIG. 2 is a power source 6, configure to charge an electrode 4 with a charge. An electrical connection 7 exists between the power source 6 and the electrode 4.

Further shown in FIG. 2 is a control unit 9, configured to control and stabilise the shape of the polymer structure formed in the polymer material 2. Similar to FIG. 1, also FIG. 2 shows the electrode 4, arranged above the polymer material 2. Not shown in FIG. 2 is a polymer structure formed in the polymer material 2. As explained, the applicant has found that as the polymer structure is forming in the polymer material 2, shortly (e.g. milliseconds) before the polymer structure sprays towards the electrode 4, a current can already be measured in between the electrode 4 and the polymer material 2.

Further shown in FIG. 2 is a measurement unit 10, here a shunt resistor 5, that is configured to monitor the occurrence and the magnitude of the current between the electrode 4 and the uncured microscopic polymer structure 2A, while the electrode 4 is charged. More specifically, the shunt resistor 5 is electrically connected in series with the electrode 4.

The measurement unit 10 is arranged in communication with the control unit 9. During operation of the system and/or the assembly, that is, while performing the method according to the invention, a current between the electrode 4 and the polymer structure 2A is expected. The measurement unit 10 measures this current indirectly. While performing the measurement and providing the amperage of the current, the control unit 9 compares the amperage of the current to a pre-set threshold value. With reference to FIG. 1 again, when this threshold value is exceeded, the height of the formed polymer structure 2A is expected to exceed the imaginary line L. As this is undesired, action is taken by the control unit 9. According to the invention, this action can be reducing the charge on the electrode 4 and/or increasing the distance between the electrode 4 and the polymer structure.

In the embodiment of FIG. 2, the first of these actions is schematically shown: reducing the charge on the electrode 4. Therefore, a mosfet (metal-oxide-semiconductor field-effect transistor) switch 11 is provided, connected in parallel with the electrode. When the control unit 9 has determined that the pre-defined threshold of current between the electrode 4 and the polymer structure is exceeded, it may activate the mosfet switch 11. Upon activating the mosfet switch 11, at least a part of the charge provided by the power source 6 is shorted, reducing the charge on the electrode 4 and reducing the electrostatic attraction between the electrode 4 and the polymer structure. This reduction of charge on the electrode 4 and electrostatic attraction between electrode 4 and polymer structure stabilizes the shape of the polymer structure. A curing source may then cure the polymer structure and fixate the shape thereof, as will be explained in the below with reference to FIG. 5.

Figure 3:
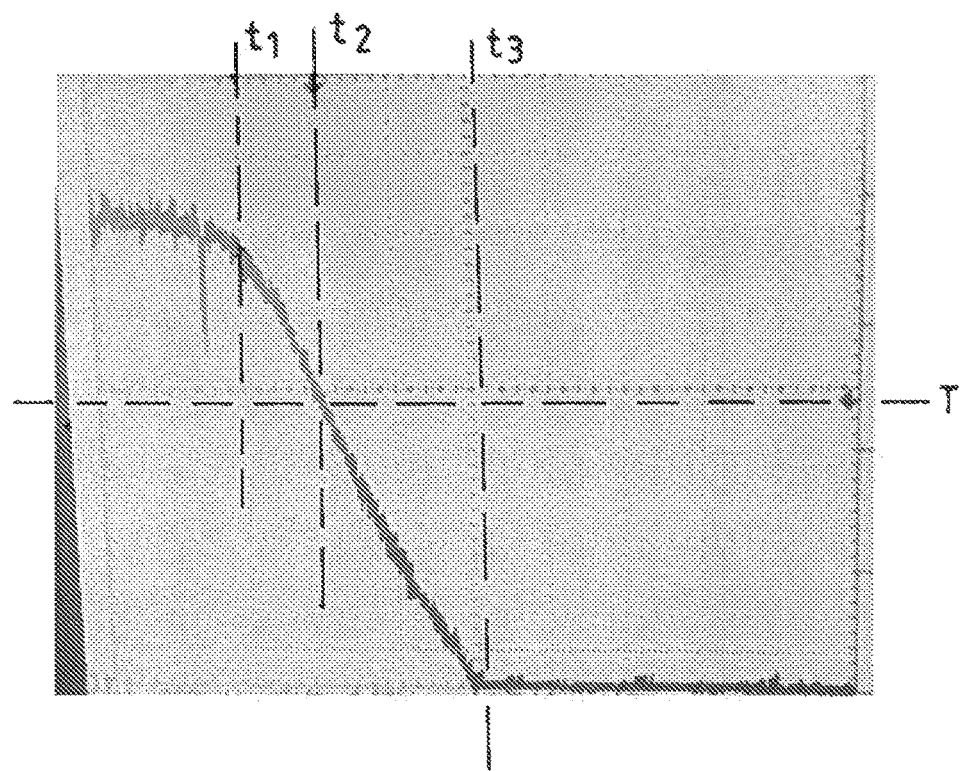
FIG. 3 schematically shows a monitoring unit that measures the current through a shunt resistor as the system according to FIG. 2 is operated.

FIG. 3 shows a snapshot of a monitor screen displaying the voltage on the shunt resistor 5, e.g. while operating the system of FIG. 2. Time is linearly displayed on the horizontal axis and increases from the left to the right, while the voltage on the shunt resistor is linearly displayed on the vertical axis. As seen, initially, the voltage through the shunt resistor is relatively constant, indicating that no current is present between the electrode 4 and the polymer structure. As time progresses, approximately at time t1, less voltage is measured on the shunt resistor; indicating that a current flows through the shunt resistor. At time t2 a threshold T may be reached, at which time action would normally be taken when operating the system. However, in the graph shown in FIG. 3 the system is operated beyond time t2, until the polymer material contacts the electrode, more current is flowing through the shunt resistor, and the voltage through the shunt resistor is substantially 0. In the present example, the time between measuring the first current at approximately time t1, where the line has a negative gradient, and the spraying of polymer material towards the electrode, at approximately time t3, may be as small as 20 ms. Hence, from FIG. 3 it follows that action to reduce the electrostatic attraction between the electrode and the polymer structure may be required in a timespan as short as 15 ms, as otherwise spraying has already occurred.

Figure 4:
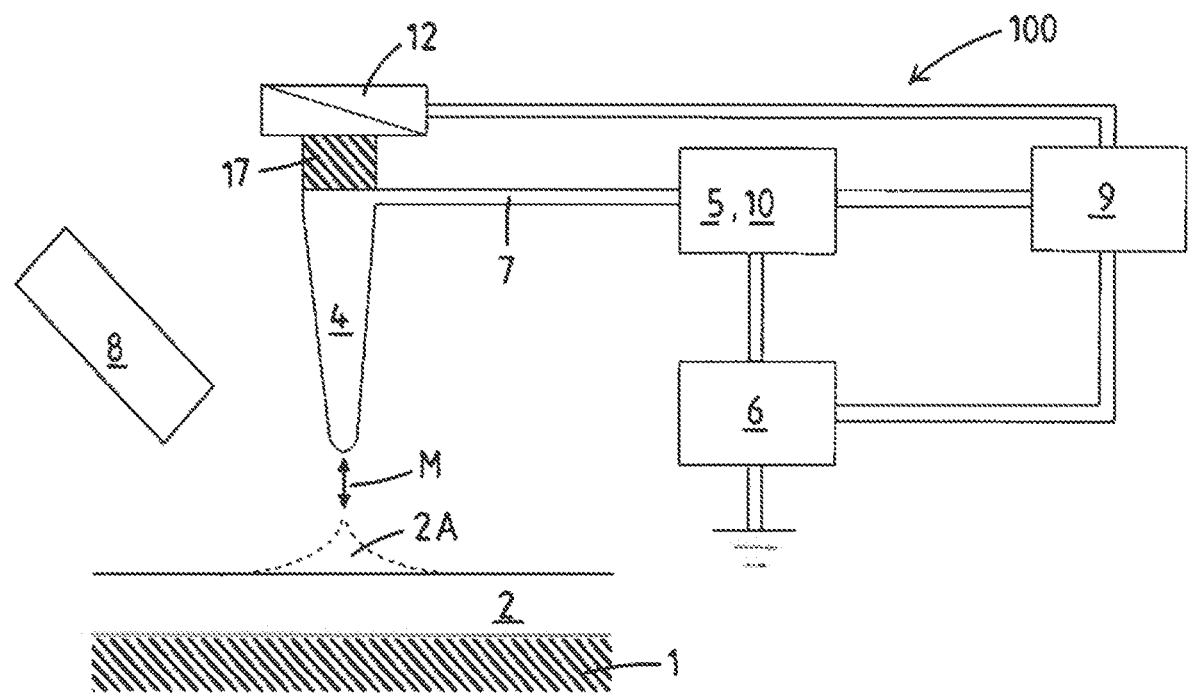
FIG. 4 schematically shows parts of a second embodiment of a system to provide a base structure at least partially with a cured polymer coating having microscopic polymer structures according to the invention.

FIG. 4 shows a second embodiment of a system (partially) and/or assembly 100 to provide a base structure 1 at least partially with a cured polymer coating formed by microscopic polymer structures 2A. Similar to FIG. 2, the assembly/system of FIG. 4 also comprises a power source 6, a control unit 9, a current measurement unit 10, and a base structure 1 with applied thereon a polymer material 2 that has an electrical charge. The working principle of the power source 6, the control unit 9, and the current measurement unit 10 of the system/assembly according to FIG. 4 is similar to the working principle of the power source 6, the control unit 9, and the current measurement unit 10 of the system/assembly according to FIG. 2 and will therefore not be repeated.

Where the assembly/system of FIG. 2 however uses a mosfet switch 11 to control and stabilise the shape of the polymer structure 2, the assembly/system of FIG. 4 uses an actuator 12 to control and stabilise the shape of the polymer structure 2A. In a way similar to the working of the assembly of FIG. 2, when the control unit 9 determines that the amperage of current between the electrode 4 and the polymer structure 2A exceeds a pre-set threshold, the actuator 12 moves the electrode away from the polymer structure 2A (indicated by arrows M). By moving the electrode 4 away from the polymer structure 2A, the electrostatic attraction between the electrode 4 and the polymer structure 2A is reduced, stabilizing the shape of the formed polymer structure 2A.

Shown in FIG. 4 is that the actuator 12, e.g. a piezo element, is physically separated from the electrode 4 by an isolation element 17.

Also visible in FIG. 4 is a curing source 8, configured to cure (harden) the uncured microscopic polymer structure 2A and form the cured polymer coating.

Figure 5:
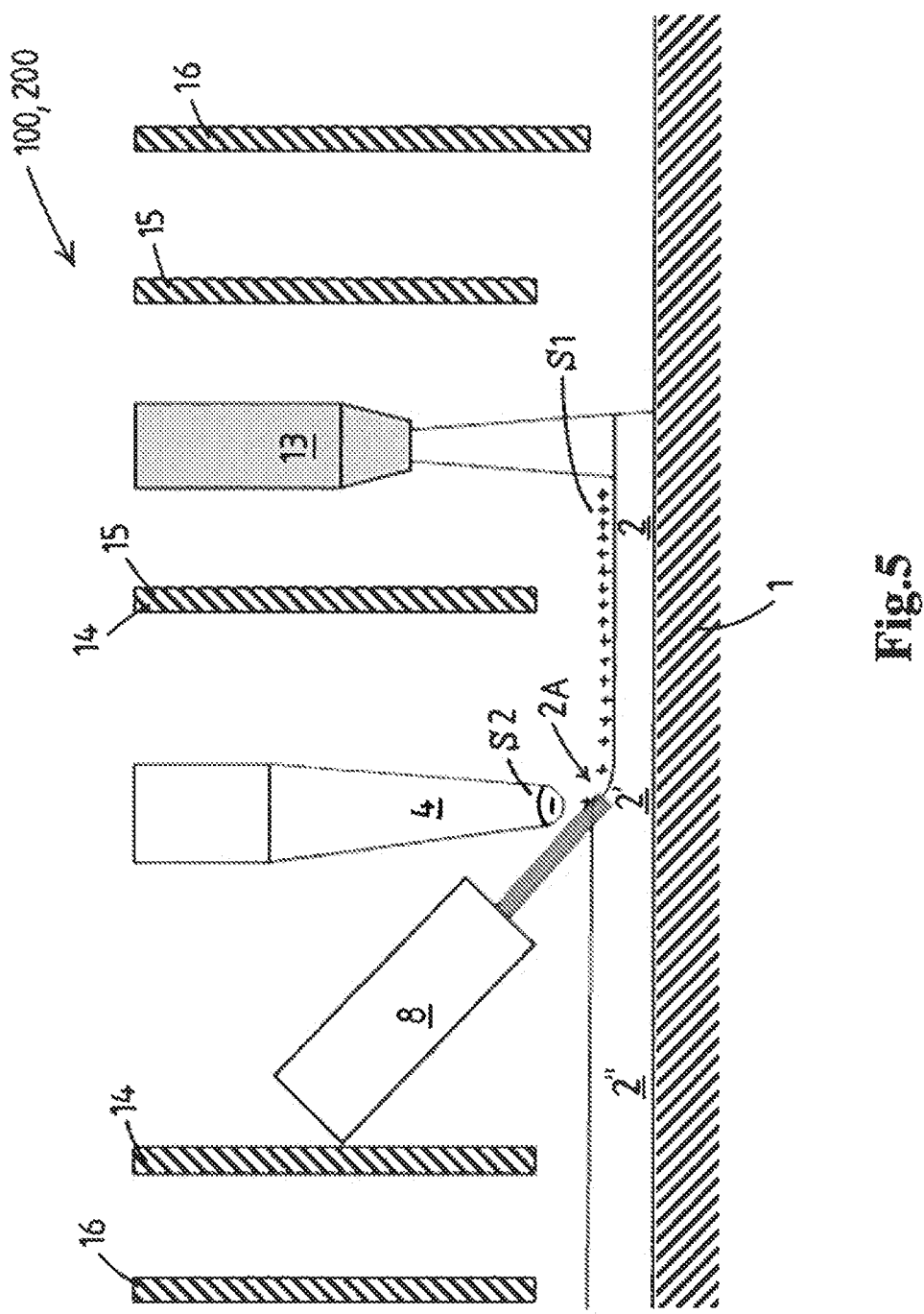
FIG. 5 schematically shows an embodiment of a method according to the invention.

The different steps of the method may be explained in an alternative way with reference to FIG. 5.

Shown in FIG. 5 is a device 13 configured to apply a coating of an uncured polymer material 2 having an electrical charge of a first sign S1 on a base structure 1. This application of the uncured polymer material may for example be done with electrospinning or with electrohydrodynamic printing. The device 13 is here physically separated from the electrode 4 by device separation walls 15.

Further shown in FIG. 5 is an electrode 4, provided at a distance above at least a part of said uncured polymer material 2. The electrode 4 is charged with an electrical charge that has a second sign S2 opposite to the first sign. Thereby uncured polymer material 2 is electrostatically attracted towards the electrode 4 and the uncured polymer material 2 is deformed into uncured structured polymer material 2' including an uncured microscopic polymer structure 2A that has a shape. Well visible in FIG. 5 is the uncured polymer material 2 applied by the device 13 and not yet deformed, and the uncured structured polymer material 2' including an uncured microscopic polymer structure 2A that is being formed by the electrode 4. The electrode 4 is physically separated from the device 13 by device separation walls 14.

Once the uncured microscopic polymer structure 2A is formed, its shape is controlled and stabilized, e.g. in a way as explained in the above.

Also visible in FIG. 5 is a curing source 8 configured to cure the uncured microscopic polymer structures 2A and form the cured polymer coating 2".

In FIG. 5, the assembly 100, comprising the device 13, the electrode 4 and the curing source 8 have been operated for a period of time already, and have been moved during operation with respect to the base surface. This has resulted in the formation of an elongated, elevated, riblet-shaped line of coating. Upon continued operation of the assembly 100, a longer line of coating may be formed (e.g. by moving the base surface to the left of the figure or by moving the assembly to the right of the figure). Another line may also be formed, e.g. parallel to the shown line, by moving either the base surface 1 or the assembly 100 into or out of the figure. This way, the size of the coating 2" applied on the base structure 1 may be increased.

FIG. 6 schematically shows a robot arm 300 comprising a system 100, e.g. the system 100 as shown in FIG. 4, to provide a base structure 1, here an aircraft wing, at least partially with a cured polymer coating 2" having microscopic polymer structures 2A. The robot arm 100 may, depending on the desired coating 2", e.g. scan across the base structure 1 in a longitudinal direction with respect to a longitudinal axis of the arm or scan across the base structure 1 in a lateral direction with respect to a longitudinal axis of the arm to apply a coating 2" to the base surface. As the arm 300 is moved along the surface, the area of the coating 2" increases.

The invention claimed is:

1. A method to provide a base structure at least partially with a cured polymer coating having microscopic polymer structures, the method comprising the steps of:
    applying an uncured polymer material on at least a part of the base structure, the uncured polymer material being electrically charged with a charge that has a first sign;
    providing at least one electrode at a distance above at least a part of said uncured polymer material;
    charging the at least one electrode with an electrical charge that has a second sign opposite to the first sign, thereby electrostatically attracting uncured polymer material towards the at least one electrode and deforming the uncured polymer material into uncured structured polymer material comprising one or more uncured microscopic polymer structures that have a shape, wherein electrostatically attracting the uncured polymer material towards the at least one electrode grows the one or more uncured microscopic polymer structures towards the at least one electrode;
    curing the one or more uncured microscopic polymer structures, thereby forming the cured polymer coating;
    wherein before or during the step of curing the one or more uncured microscopic polymer structures the method comprises the step of stopping or reducing the growth of the uncured microscopic polymer structure for controlling and stabilizing the shape of the one or more uncured microscopic polymer structures, with the uncured structured polymer material being at a distance from the at least one electrode, thereby preventing contact between the uncured polymer material and the at least one electrode at all times, by monitoring the occurrence and amperage of a current between the electrode and the uncured microscopic polymer structures, and measuring the current between the electrode and the uncured microscopic polymer structure, while the at least one electrode is charged; setting a threshold value for said amperage; and when said threshold value of amperage is exceeded, at least reducing said amperage by reducing the electrical charge on the electrode and/or increasing the distance between the electrode and the uncured microscopic polymer structure.

2. The method of claim 1, wherein the current between the uncured microscopic polymer structure and the electrode is measured by a shunt resistor that is electrically connected in series with the electrode.

3. The method of claim 1, wherein the threshold value of amperage has a magnitude of less than 100 nanoampere.

4. The method of claim 1, wherein the electrode is electrically connected to a power source with a connection, and wherein electrical charge on the electrode is reduced by shorting said connection.

5. The method of claim 1, wherein the electrical charge on the electrode is reduced by altering an output voltage of a power source that charges the electrode.

6. The method of claim 1, wherein the current between the uncured microscopic polymer structure and the electrode is reduced by moving the electrode away from the base structure and the uncured microscopic polymer structure.

7. The method of claim 1, wherein the step of curing the one or more uncured microscopic polymer structures is performed while stabilizing the one or more uncured microscopic polymer structures.

8. The method of claim 1, further comprising the step of moving the electrode to a different position above the base structure, and repeating all other method steps.

9. The method of claim 8, wherein a tailored pattern of microscopic polymer structures is formed by repeatingly moving the electrode to a different position above the base structure and repeating all other method steps.

10. An assembly to provide a base structure at least partially with a cured polymer coating having microscopic polymer structures, the base structure being provided with an uncured polymer material that has an electrical charge of a first sign, the assembly comprising:
    at least one electrode, configured to be arranged at a distance above at least a part of the uncured polymer material;
    at least one power source, electrically connected with the electrode and configured to charge the electrode with an electrical charge that has a second sign opposite of the first sign such that, after charging the electrode, uncured polymer material is electrostatically attracted towards the electrode, deforming the uncured polymer material into uncured structured polymer material comprising one or more uncured microscopic polymer structures that have a shape, wherein electrostatically attracting the uncured polymer material towards the at least one electrode grows the one or more uncured microscopic polymer structures towards the at least one electrode;
    a curing source, configured to cure the uncured microscopic polymer structures and form the cured polymer coating; and
    a control unit, configured to stop or reduce the growth of the uncured microscopic polymer structure for controlling and stabilising the shape of the uncured microscopic polymer structure, with the uncured structured polymer material being at a distance from the at least one electrode, thereby preventing contact between the uncured polymer material and the at least one electrode at all times,
    wherein the control unit comprises a current measurement unit, configured to measure a current between the electrode and the uncured microscopic polymer structure, and to monitor the occurrence and amperage of a current between the electrode and the uncured microscopic polymer structures and arranged in communication with the control unit; wherein the control unit allows for the setting of a threshold value for said amperage, and wherein the control unit is configured to reduce the charge on the electrode and/or increase the distance between the electrode and the uncured microscopic polymer structure when said current exceeds said threshold value of amperage.

11. The assembly of claim 10, wherein the control unit includes a switch configured to short the electrical connection between the power source and the electrode.

12. The assembly of claim 10, wherein the control unit includes an actuator operatively connected to the electrode, the actuator being configured to move the electrode away from the uncured microscopic polymer structure.

13. A system to provide a base structure at least partially with a cured polymer coating having microscopic polymer structures, the system comprising:
    a polymer application device configured to apply uncured polymer material having an electrical charge on a base structure; and
    the assembly according to claim 10.

14. A mechanical arm, comprising the assembly according to claim 10.

15. A mechanical arm, comprising the system according to claim 13.

\* \* \* \* \*